United States Patent
Trevor et al.

(10) Patent No.: US 7,238,938 B2
(45) Date of Patent: Jul. 3, 2007

(54) ENERGY SELECTING SLIT AND ENERGY SELECTIVE SAMPLE ANALYSIS SYSTEMS UTILIZING THE SAME

(75) Inventors: Colin Geoffrey Trevor, Pleasanton, CA (US); Frank E. Dickerson, Pleasanton, CA (US); Matt Bjork, Oakland, CA (US)

(73) Assignee: Gatan, Inc., Warrendale, PA (US)

( * ) Notice: Subject to any disclaimer, the term of this patent is extended or adjusted under 35 U.S.C. 154(b) by 264 days.

(21) Appl. No.: 11/155,018

(22) Filed: Jun. 16, 2005

(65) Prior Publication Data
US 2007/0018095 A1 Jan. 25, 2007

(51) Int. Cl.
*H01J 49/48* (2006.01)

(52) U.S. Cl. .................. 250/305; 250/306; 250/311; 250/396 R; 250/397

(58) Field of Classification Search .................. None
See application file for complete search history.

(56) References Cited

U.S. PATENT DOCUMENTS

| | | |
|---|---|---|
| 4,851,670 A | 7/1989 | Krivanek |
| 5,097,126 A | 3/1992 | Krivanek |
| 5,640,012 A | 6/1997 | Krivanek |
| 5,798,524 A | 8/1998 | Kundmann et al. |
| 6,184,524 B1 | 2/2001 | Brink et al. |
| 6,960,763 B2* | 11/2005 | Lopez et al. ................. 250/305 |

* cited by examiner

*Primary Examiner*—Jack I. Berman
*Assistant Examiner*—Zia R. Hashmi
(74) *Attorney, Agent, or Firm*—Caesar, Rivise, Bernstein, Cohen & Pokotilow, Ltd.

(57) ABSTRACT

A device comprising an energy selecting slit assembly is provided. The slit assembly comprising a slit assembly chassis, opposing slit mechanisms, and an actuator assembly. One of the terminal ends of the actuator arm comprises a relatively fixed terminus, while the other terminal end of the arm comprises a relatively mobile terminus coupled to the rotational slit mechanism via a mechanical coupling configured to translate movement of the mobile terminus into rotational of the rotational slit mechanism. In one embodiment of the present invention, the slit assembly chassis defines a plurality of fixturing datums configured to establish alignment of respective aperture-defining edges of the opposing slit mechanisms along orthogonal X, Y, and Z axes defined by the chassis. Additional embodiments are disclosed.

32 Claims, 10 Drawing Sheets

US 7,238,938 B2

ENERGY SELECTING SLIT AND ENERGY SELECTIVE SAMPLE ANALYSIS SYSTEMS UTILIZING THE SAME

BACKGROUND OF THE INVENTION

The present invention relates to energy selective sample analysis systems and, more particularly, to an energy selecting slit assembly for use in such systems.

Energy filtered sample analysis systems commonly employ a source of charged particles and an imaging system to analyze the structure and/or composition of a sample under examination. The primary components of such systems include the charged particle source, suitable charged particle optics for directing a beam of particles towards and away from the sample under analysis, and a charged particle imaging system configured to provide an intelligible representation of the sample under analysis.

For example, and not by way of limitation, electron microscopes are capable of imaging individual atoms in a thin sample. However, the images produced by the microscope alone contain no direct information concerning the chemical composition of the sample, and the image quality degrades significantly if the sample is more than a few atomic planes thick. The chemical information can be provided by selectively imaging only with electrons that have experienced energy losses characteristic of particular atomic species while traversing the sample. Thus, electrons that have experienced non-representative energy losses are filtered out allowing further optics to create monochromatic images. These images can be combined to give maps of chemical or elemental distributions. They can also be used for a number of other analytical techniques. For example, and not by way of limitation, the images can be used to improve spatial resolution on thick samples and to remove inelastic signals prior to quantitative analysis.

A common method of energy filtering utilizes an energy-selected electron imaging filter in a transmission electron microscope. For example, and not by way of limitation, U.S. Pat. Nos. 4,851,670, 5,097,126, 5,640,012, 5,798,524, and 6,184,524, the disclosures of which are incorporated herein by reference, each relate to an energy filtered sample analysis system of this nature. The present invention is directed towards providing improvements in energy-selected electron imaging filters and other similarly configured charged particle filters.

BRIEF SUMMARY OF THE INVENTION

The present invention is directed to the design of energy selecting slit assemblies and to devices incorporating such assemblies. In accordance with one embodiment of the present invention, an energy selecting slit assembly is provided comprising a slit assembly chassis, opposing slit mechanisms, and an actuator assembly. The opposing slit mechanisms and the actuator assembly are mechanically coupled to the slit assembly chassis. The opposing slit mechanisms are configured to define a charged particle aperture between respective aperture-defining edges of the opposing slit mechanisms. One of the opposing slit mechanisms comprises a rotational slit mechanism and defines a longitudinal axis of rotation about which the rotational slit mechanism is configured to pivot. The actuator assembly comprises an actuator arm comprising a pair of terminal ends, one of the terminal ends comprising relatively fixed terminus and another of the terminal ends comprising a relatively mobile terminus. The actuator arm is secured to the slit assembly chassis proximate the relatively fixed terminus. The actuator arm is coupled to the rotational slit mechanism via a mechanical coupling positioned proximate the relatively mobile terminus. The mechanical coupling is configured to couple movement of the relatively mobile terminus of the actuator arm with movement of the rotational slit mechanism about the longitudinal axis of rotation of the rotational slit mechanism.

In accordance with another embodiment of the present invention, the slit assembly chassis defines three orthogonal X, Y, and Z axes. The longitudinal axis of rotation of the rotational slit mechanism is parallel to the X-axis defined by the slit assembly chassis. The actuator assembly is configured to pivot the rotational slit mechanism about the longitudinal axis of rotation. The charged particle aperture between the respective aperture-defining edges of the opposing slit mechanisms varies in size in a direction parallel to the Y axis. The slit assembly chassis defines a plurality of fixturing datums configured to establish alignment of the respective aperture-defining edges of the opposing slit mechanisms along the Y and Z axes. The energy selecting slit assembly further comprises one or more securements independent of the fixturing datums and the securements are configured to fix the opposing slit mechanisms in respective positions established by the fixturing datums.

Accordingly, it is an object of the present invention to provide improvements to the design of energy selecting slit assemblies and to the devices incorporating such assemblies. Other objects of the present invention will be apparent in light of the description of the invention embodied herein.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
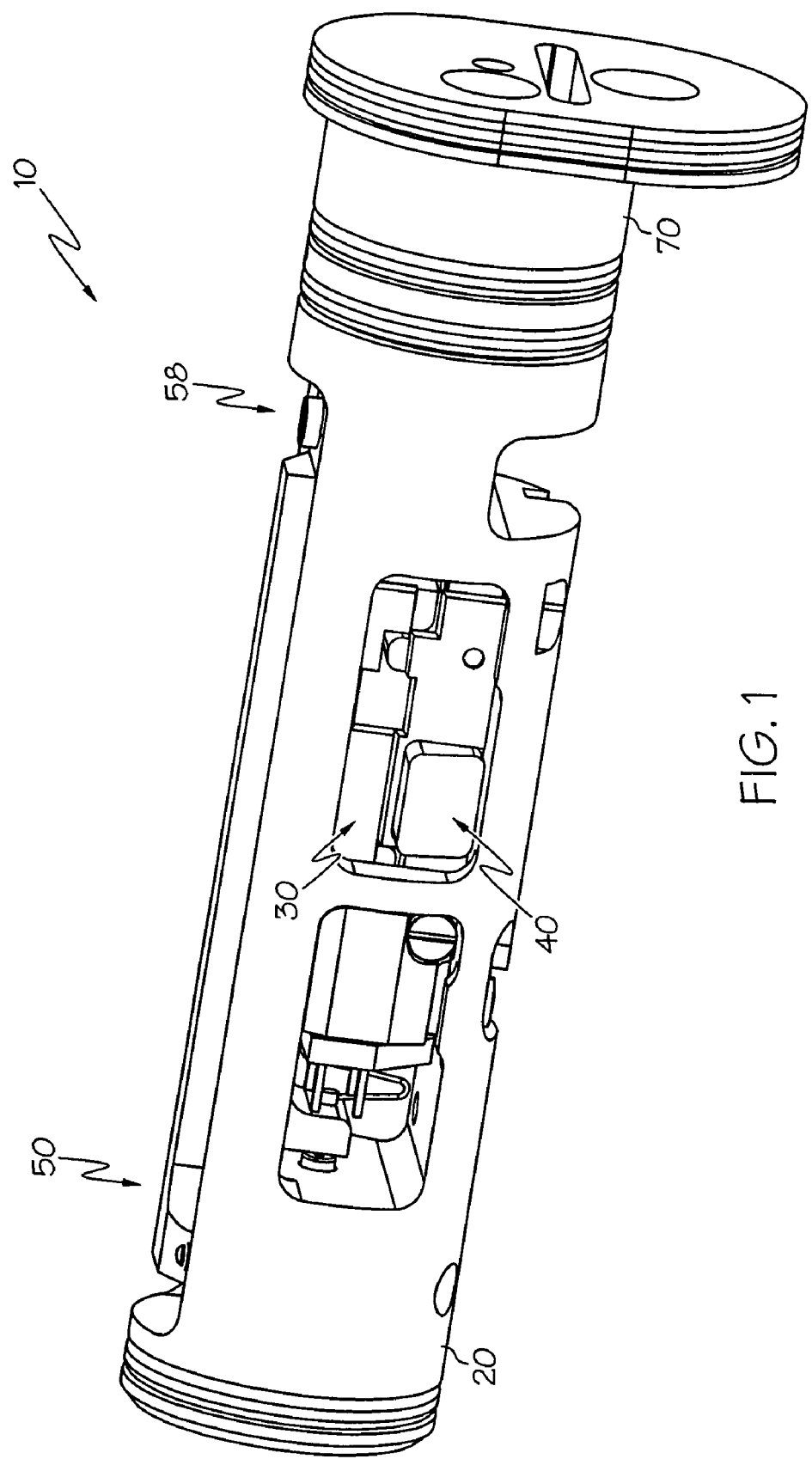
FIG. 1 is an isometric illustration of an energy selecting slit assembly according to one embodiment of the present invention.

Although the present invention is not limited to one particular embodiment or one specific configuration, the various concepts of the present invention can be illustrated with reference to the particular embodiment illustrated in FIGS. 1-9. Referring collectively to FIGS. 1-9, where like structure is indicated with like reference numerals, an energy selecting slit assembly 10 according to one embodiment of the present invention comprises a slit assembly chassis 20, opposing slit mechanisms 30, 40, and an actuator assembly 50. The aforementioned components of the slit assembly 10 are clearly illustrated as separate components in the exploded views of FIGS. 2 and 3.

Figure 2:
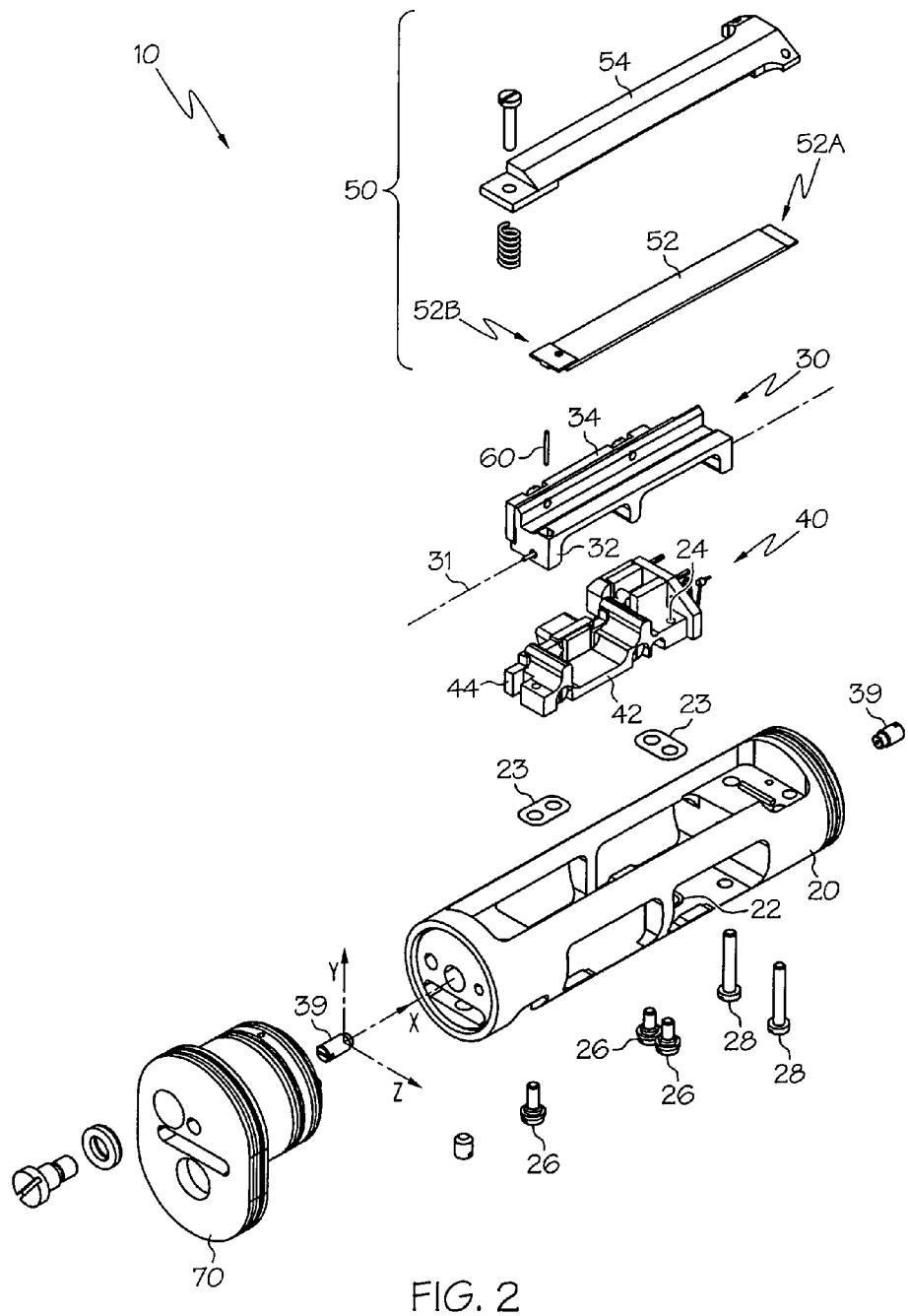
FIGS. 2 and 3 are exploded views of the energy selecting slit assembly illustrated in FIG. 1.
Figure 3:
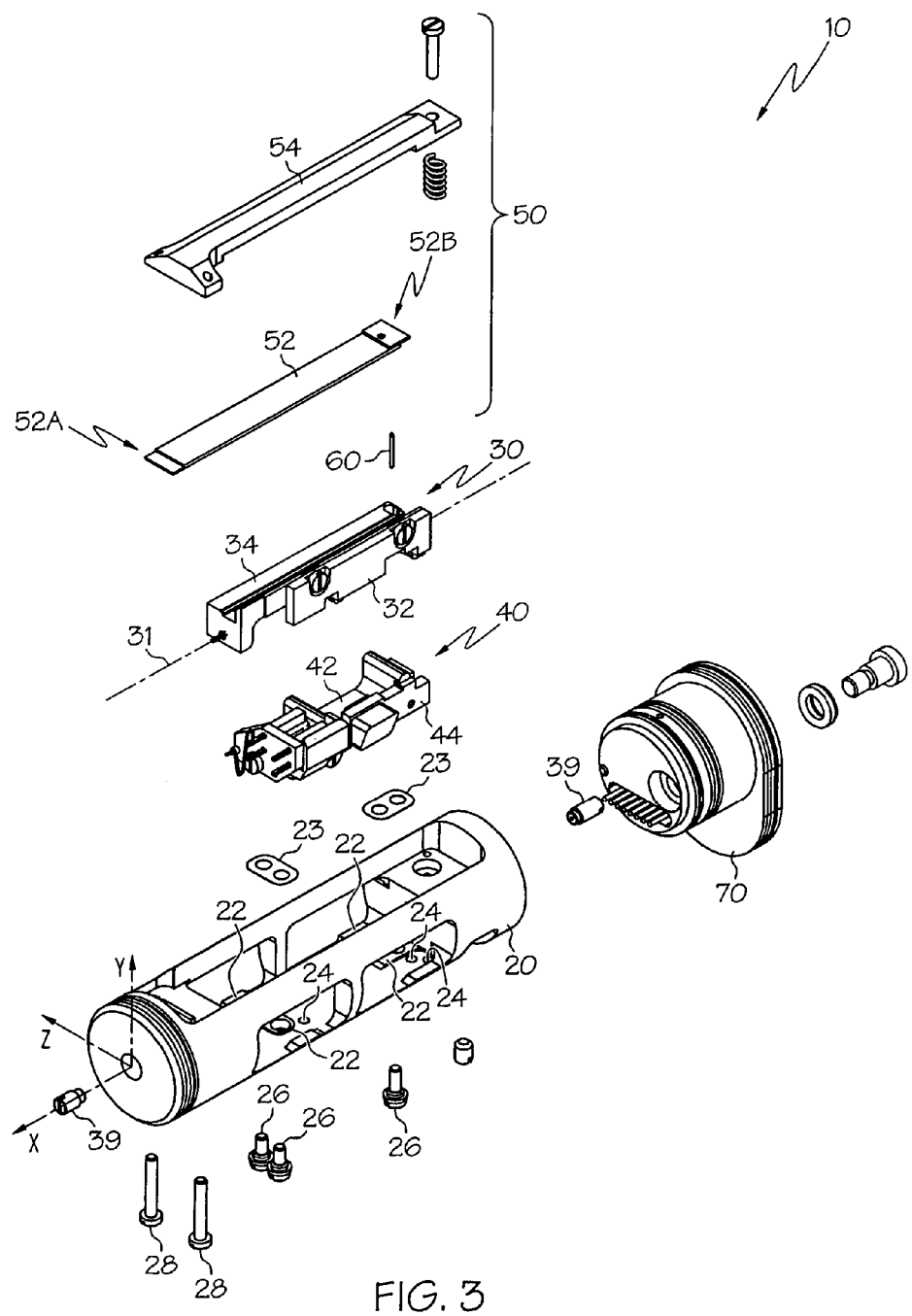

FIGS. 2 and 3 also present, in exploded form, a wobblestick 60, a chassis mounting assembly 70, and various mounting hardware. The individual components of the opposing slit mechanisms 30, 40 are not illustrated in exploded form in FIGS. 2 and 3 because it is deemed that the illustrations of FIGS. 8 and 9 suffice to show the details of the respective slit mechanisms 30, 40. The opposing slit mechanisms 30, 40 and the actuator assembly 50 are mechanically coupled to the slit assembly chassis 20 in a manner described in detail below with specific reference to the fixturing datums of to the present invention. The chassis mounting assembly 70, which is configured to secure the chassis 20 via a hermetically sealed port of a vacuum chamber, can be provided in a variety of forms and can be secured to one or both ends of the chassis 20.

Figure 4:
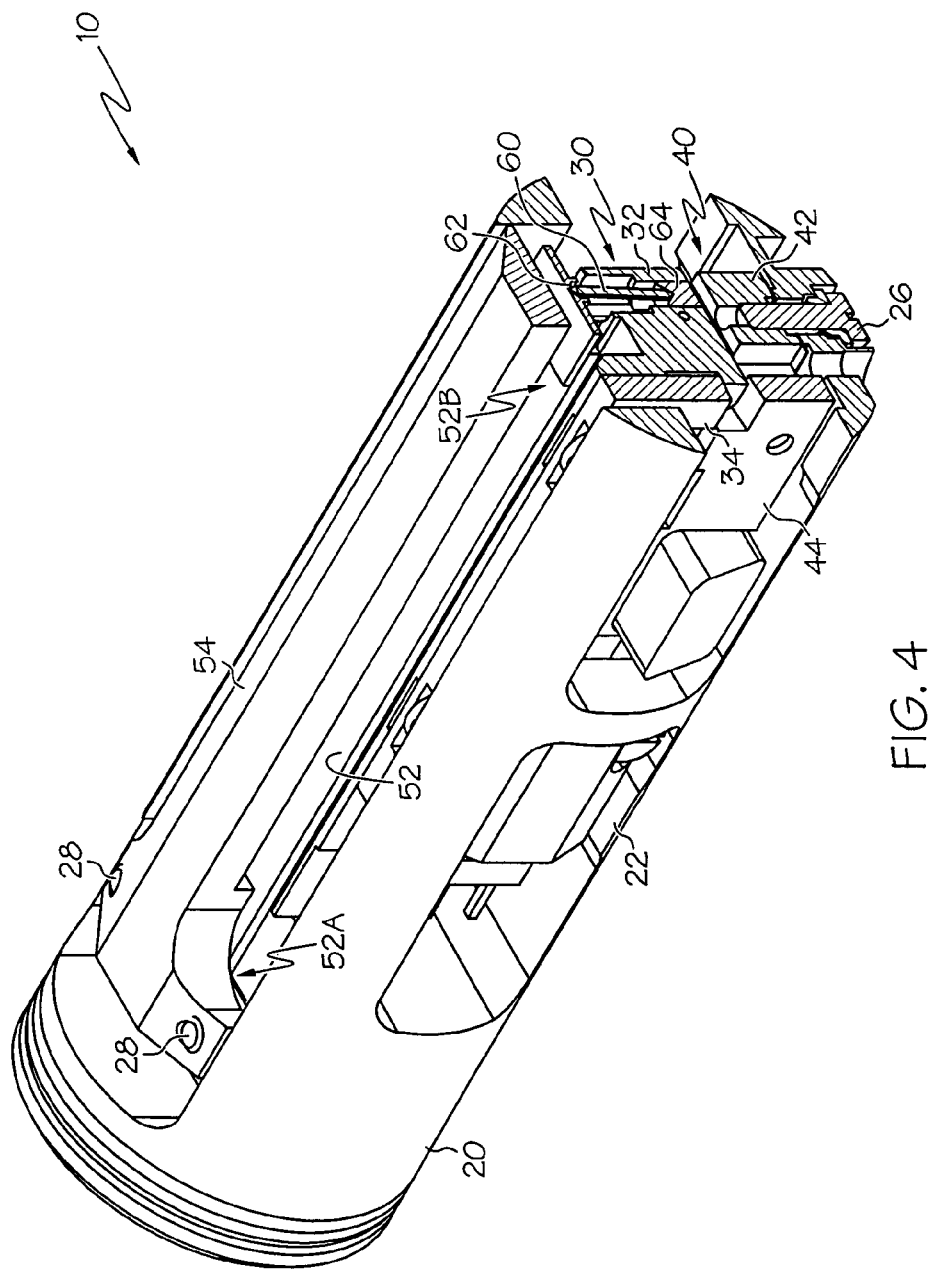
FIG. 4 is cross sectional, isometric view of the energy selecting slit assembly illustrated in FIG. 1.
Figure 5:
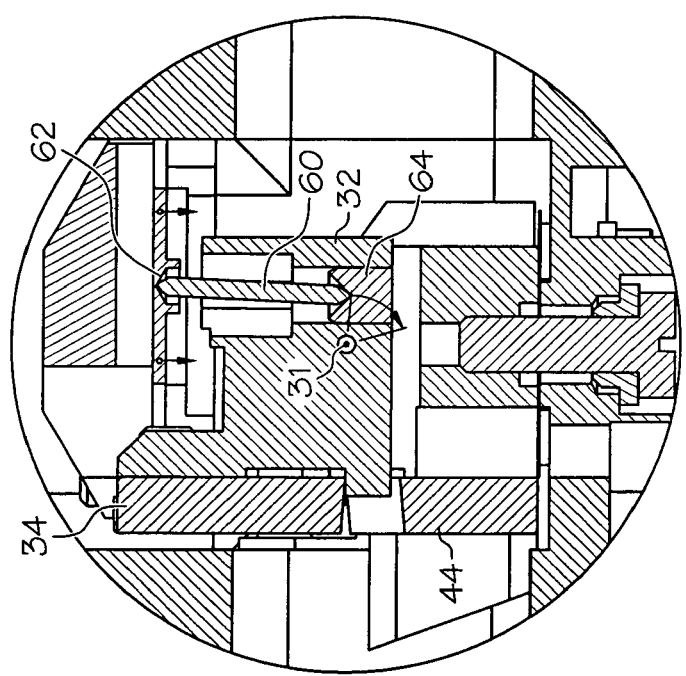
FIG. 5 is a magnified, two-dimensional illustration of the portion of the energy selecting slit assembly illustrated in cross section in FIG. 4.

Referring to FIGS. 4 and 5, one of the opposing slit mechanisms is a rotational slit mechanism 30 while the other slit mechanism is a stationary slit mechanism 40. The rotational slit mechanism 30 defines a longitudinal axis of rotation 31 about which it is configured to pivot. The actuator assembly 50 is mechanically coupled to the rotational slit mechanism 30 via the wobblestick 60 such that linear motion imparted to the wobblestick 60 by the actuator assembly 50 translates into rotational motion of the rotational slit mechanism 30 about the longitudinal axis of rotation 31.

Figure 6:
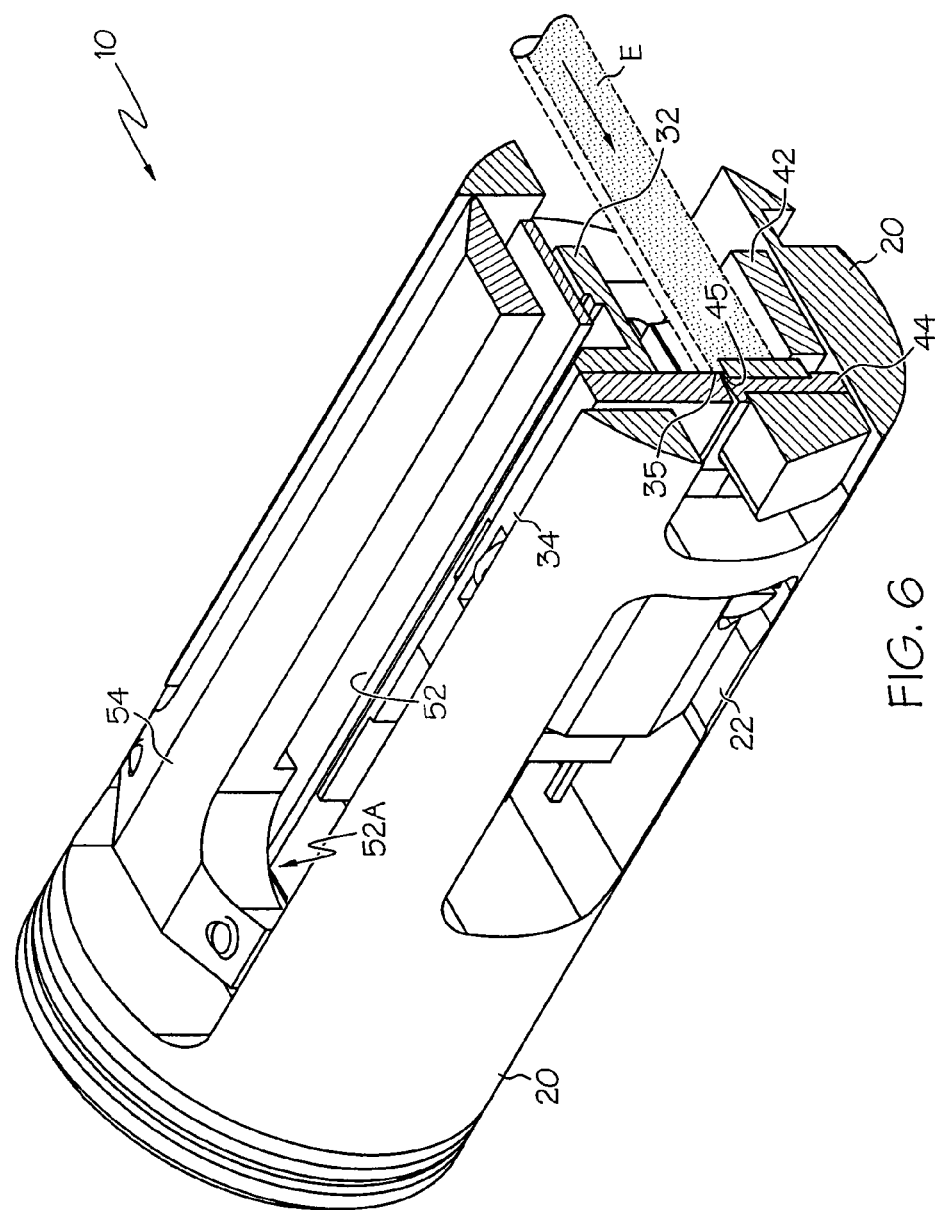
FIG. 6 is an additional cross sectional, isometric view of the energy selecting slit assembly illustrated in FIG. 1.
Figure 7:
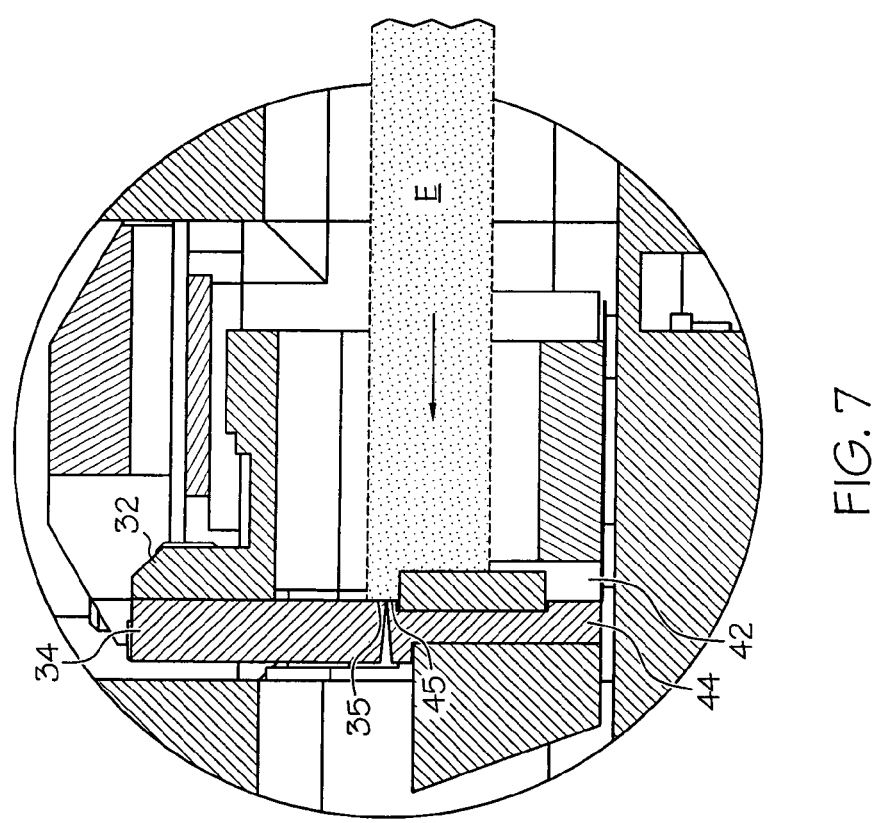
FIG. 7 is a magnified, two-dimensional illustration of the portion of the energy selecting slit assembly illustrated in cross section in FIG. 6.

Referring specifically to FIGS. 6 and 7, the opposing slit mechanisms 30, 40 are configured to define a charged particle aperture between respective aperture-defining edges 35, 45 of the opposing slit mechanisms 30, 40. The respective aperture-defining edges 35, 45 of the opposing slit mechanisms 30, 40 are oriented substantially parallel to each other and parallel to the longitudinal axis of rotation 31 of the rotational slit mechanism 30. The aperture illustrated in FIGS. 6 and 7 is essentially a "zero" aperture because the opposing slit mechanisms are oriented in the closed position. However, the actuator assembly 50 and the associated wobblestick 60, discussed in detail herein with reference to FIGS. 4 and 5, can be employed to expand the size of the aperture through rotation of the rotational slit mechanism 30 about its axis of rotation 31. In this manner, various aperture configurations can be selected to pass different portions of an incident beam E of charged particles for detection downstream of the respective aperture-defining edges 35, 45.

As is noted above, charged particle analysis systems often generate a beam of charged particles where the collective cross-sectional profile of the beam represents the sample of interest over a wide energy spectrum and where select portions of the profile of the beam represent the sample of interest over distinct energy bands. Accordingly, the charged particle aperture defined between the aperture-defining edges 35, 45 may be employed, in cooperation with the optics of the charged particle analysis system, to select a specific pass band of the charged particle beam E for detection and analysis downstream of the aperture-defining edges 35, 45. For example, in the context of transmission electron microscopy, the aperture may be utilized to detect and analyze only those electrons that have experienced energy losses characteristic of particular atomic species while traversing the sample. Thus, electrons that have experienced non-representative energy losses are filtered out by the opposing slit mechanisms 30, 40, allowing further optics to create monochromatic images. These images can be combined to give maps of chemical or elemental distributions or can be used for a number of other analytical techniques.

Returning to FIGS. 4 and 5, it is noted that the actuator assembly 50 comprises an actuator arm 52, which in turn comprises a pair of terminal ends 52A, 52B. One of the terminal ends 52A defines a relatively fixed terminus while the other of the terminal ends 52B defines a relatively mobile terminus. The actuator arm 52 is secured to the slit assembly chassis 20 proximate to the relatively fixed terminus 52A with suitable mounting hardware 28 and is coupled to the rotational slit mechanism 30 via the wobblestick 60, which is positioned proximate the relatively mobile terminus 52B. For the purposes of defining and describing the present invention, it is noted that the respective degrees of mobility attributed to each of the terminal ends 52A, 52B are presented in relation to each other. Thus, the relatively fixed terminus 52A is "fixed" in the sense that it is significantly less mobile that the mobile terminus 52B, and vice-versa.

As is noted above, the wobblestick 60 functions as a mechanical coupling in that it is configured to couple relatively linear movement of the relatively mobile terminus 52B of the actuator arm 52 with rotational movement of the rotational slit mechanism 30 about its longitudinal axis of rotation 31 while minimizing parasitic stick/slip friction. Although the particular configuration of the wobblestick 60 may vary according to the specific physical environment at hand, in the illustrated embodiment, the wobblestick 60 comprises a generally linear coupling that is sized to be received in respective wobblestick receptors 62, 64 provided in the actuator arm 52 and the rotational slit mechanism 30. Each receptor 62, 64 is configured to permit the wobblestick 60 to pivot therein. For example, referring to FIG. 5, as the actuator arm 52 initiates movement of the upper end of the wobblestick 60 in a generally downward direction, the lower end of the wobblestick 60 moves along an arc defined by the rotational slit mechanism 30. Accordingly, the degree of pivoting provided by the wobblestick and the respective receptors 62, 64 should be sufficient to permit significant rotation of the rotational slit mechanism 30.

For the purpose of illustration, and not by way of limitation, the actuator assembly 50 can be configured such that the mobile terminus 52B of the actuator arm 52 defines a displacement of up to about 0.015 inches (0.38 mm). Further, the remaining geometries associated with the wobblestick 60, the receptors 62, 64, and the aperture-defining edge 35 of the rotational slit mechanism 30, relative to the longitudinal axis of rotation 31, can be configured such that an angular rotation of the rotational slit mechanism of about 15° about the axis 31 will yield an aperture displacement of up to about 0.040 inches (1.0 mm) from the zero aperture configuration illustrated in FIGS. 6 and 7. Although slit assembly configurations of the present invention provide for a broad range of aperture sizes, the present invention should not be limited to specific aperture sizes.

The actuator assembly 50 is illustrated with greatest specificity in FIGS. 2-5. In the illustrated embodiment, the actuator arm 52 comprises a piezoelectric bender, although any other suitable actuator arm configuration is deemed to be within the scope of the present invention. An actuator mounting assembly 54 is configured to secure the actuator arm 52 to the slit assembly chassis 20. In addition, the actuator assembly 50 defines a fulcrum 56 about which the actuator mounting assembly 54 pivots. The actuator arm 52 is also configured to bend about the fulcrum 56 and the actuator mounting assembly 54 maintains a non-contact relationship with the relatively mobile terminus 52B of the actuator arm so as not to impede displace of the actuator arm 52 during operation.

By incorporating the fulcrum 56 into the structure of the actuator assembly 50, the actuator mounting assembly 54 and the actuator arm 52 can be secured in predisposed relation to the slit assembly chassis 20. An adjustment mechanism in the form of a spring loaded adjustment screw assembly 58 is configured to vary the degree to which the actuator mounting assembly 54 pivots about the fulcrum 56. In this manner, because the actuator arm 52 is configured to pivot with the actuator mounting assembly 54, the predisposed relation of the actuator arm 52 and the slit assembly chassis 20 can be adjusted to calibrate or otherwise modify the operating parameters of the energy selecting slit assembly 10. In practice, the actuator assembly 50 can be configured such that the actuator arm 52 pivots about the fulcrum 56 to a significantly lesser degree than the actuator mounting assembly. In this manner, the screw assembly 58 can be utilized to fine tune the "zero" aperture position of the mobile terminus 52B of the actuator arm 52 by adjusting the predisposed position of the actuator arm 52 relative to the slit assembly chassis 20.

Figure 10:
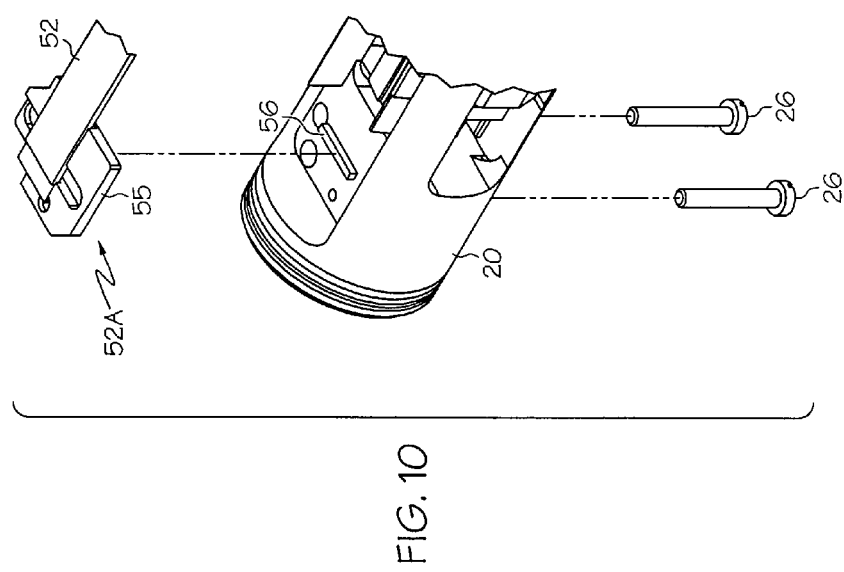
FIG. 10 is a partial break-away isometric illustration of a portion of an actuator assembly for an energy selecting slit assembly according to the present invention.

Referring to FIG. 10, it is noted that in the event the actuator arm 52 takes the form of a piezoelectric bender or some other element requiring the application of an electric potential to the arm 52, it can be beneficial to provide the actuator assembly 50 with an electrically insulating insert 55. The insert 55 effectively isolates electrically the actuator arm 52 from the slit assembly chassis 20 while mechanically interfacing the fixed terminus 52A of the actuator arm 52 and the actuator mounting assembly 54 with the slit assembly chassis 20. One or both of the aforementioned wobblestick receptors 62, 64 can also be made of electrically insulating material to further insure proper electrical isolation of the actuator arm 52. The aforementioned insert 55 can be provided as a precisely formed structure so as to provide an effective and precise means by which the actuator arm 52 can be spaced from the slit assembly chassis 20 along the direction of the Y-axis illustrated in FIGS. 2 and 3 in a consistently repeatable manner.

Turning now to the manner in which energy selecting slit assemblies according to the present invention can be assembled, it is noted that the slit assembly chassis 20 and the opposing slit mechanisms 30 and 40 define a plurality of fixturing datums that are configured to establish proper alignment of the respective aperture-defining edges 35, 45. Specifically, Referring to FIGS. 2 and 3, the slit assembly chassis 20 defines three orthogonal X, Y, and Z axes. The X-axis is parallel to the aforementioned longitudinal axis of rotation 31 of the rotational slit mechanism. The Y axis is parallel to the direction in which the charged particle aperture varies in size with rotation of the of rotational slit mechanism 30. The slit assembly chassis 20 defines at least one Y-axis fixturing datum 22 and at least one additional fixturing datum 24.

The Y-axis fixturing datums 22 are provided in the form of raised planar surfaces machined out of the slit assembly chassis so as to define a precise abutment along the Y-axis. The abutments defined by the raised planar surfaces 22 establish a minimum clearance between opposing surfaces of the slit assembly chassis 20 and the stationary slit mechanism 40 along a direction generally parallel to the Y-axis. In this manner, the raised planar surfaces 22 can be utilized to establish precise alignment of the stationary slit mechanism 40 and its associated aperture-defining edge 45 along the Y axis. In addition, respective mounting gaskets 23 are aligned with the raised planar surfaces 22 and interposed between the raised planar surfaces 22 and the stationary slit mechanism 40 to help secure the mechanism 40 to the chassis and provide electrical isolation between the chassis 20 and the mechanism 40. Although a variety of controlled thickness materials would be suitable for forming the mounting gaskets 23, it is contemplated that a Kapton® polyimide film, available from the E.I. du Pont de Nemours and Company is one example of a suitable gasket material.

The additional fixturing datums 24 are provided in the form of a pair of complementary bore holes formed in the slit assembly chassis 20 and the stationary slit mechanism 40, generally parallel to the Y axis. Fixturing pins can be inserted through the complementary bore holes 24 and subsequently removed there from following fixation of the stationary slit mechanism 40 in the unitary set of position coordinates defined by the datums 22, 24. Fixation of the stationary slit mechanism can be achieved through the use of electrically insulated or non-conducting machine screws 26 or other suitable securements. In this manner, the bore holes 24 and the fixturing pins can be utilized to establish precise alignment of the stationary slit mechanism 40 and its associated aperture-defining edge 45 along the X and Z axes. Collectively, the Y-axis and additional fixturing datums 22, 24 establish alignment of the stationary slit mechanism 40 with a unitary set of position coordinates along the X, Y, and Z axes.

Figure 8:
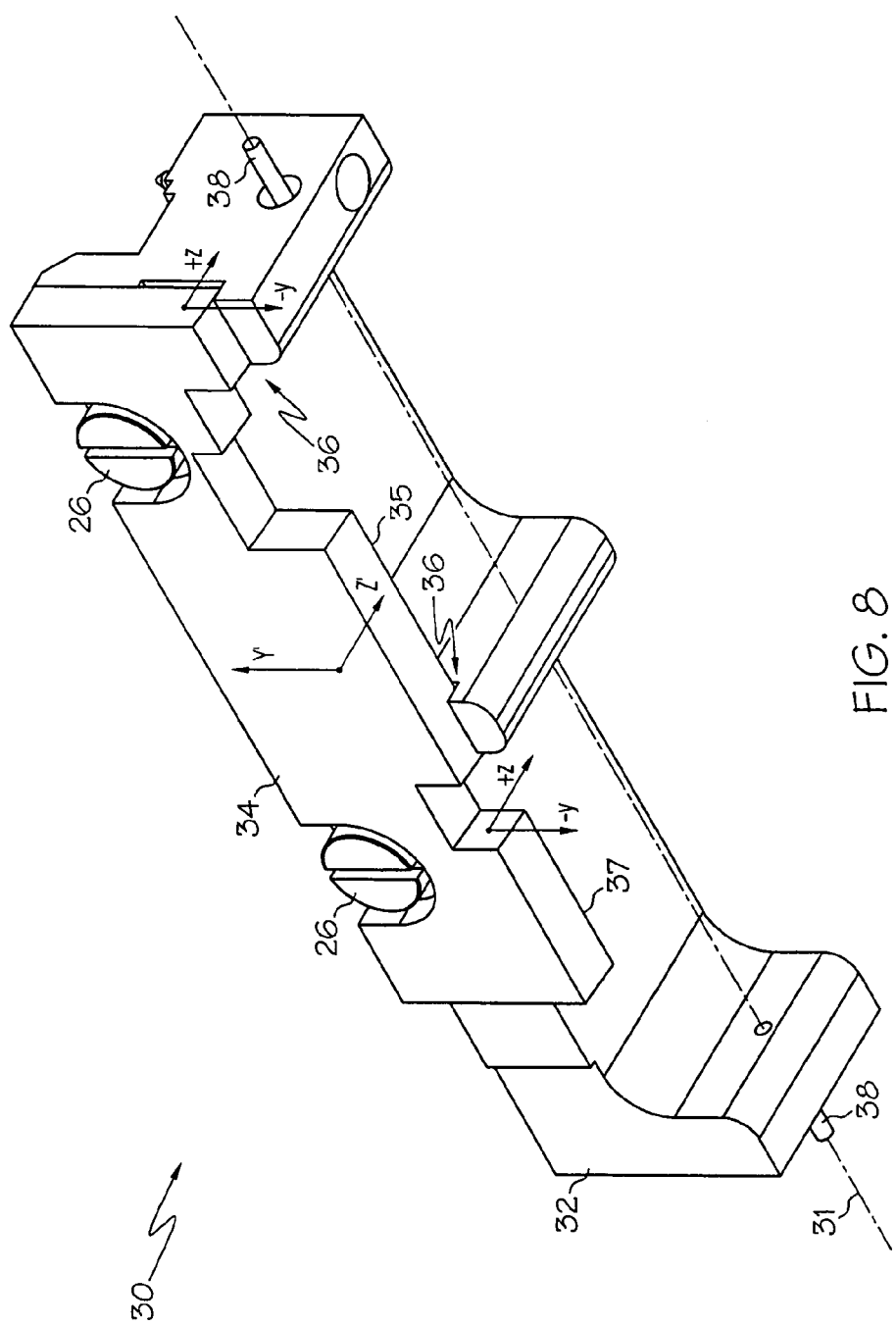
FIG. 8 is an isometric illustration of a rotational slit mechanism according to the embodiment of the present invention illustrated in FIGS. 1-7.

Referring to the rotational slit mechanism 30 illustrated in FIG. 8, it is noted that the mechanism 30 comprises, among other things, a rotational fixture 32 and a slit edge attachment 34 secured to the rotational fixture 32. The slit edge attachment 34 defines the aperture defining edge 35 of the rotational slit mechanism 30. The rotational fixture 32 defines a pair of rotational slit mechanism fixturing datums 36 that are configured to establish alignment of the rotational slit edge attachment 34 in a unitary set of position coordinates along a pair of orthogonal axes Y', Z' defined by the rotational fixture 32. Specifically, as is illustrated in FIG. 8, each of the fixturing datums 36 comprises generally orthogonal abutments that restrict movement of a properly positioned slit edge attachment 34 in the two orthogonal directions −y, +z.

The rotational slit mechanism 30 further comprises a pair of additional fixturing datums in the form of a pair of rotational pivots 38 defined along the longitudinal axis of rotation 31 of the rotational slit mechanism 30. The pair of rotational pivots 38, which are seated in corresponding jewel bearings 39 that are thread-mounted in the chassis 20, align the rotational slit mechanism 30 along a pair of orthogonal axes that are generally parallel to the Y and Z axes defined by the chassis 20. The jewel bearings 39 are configured to maintain electrical isolation between the rotational slit mechanism 30 and the chassis 20.

Figure 9:
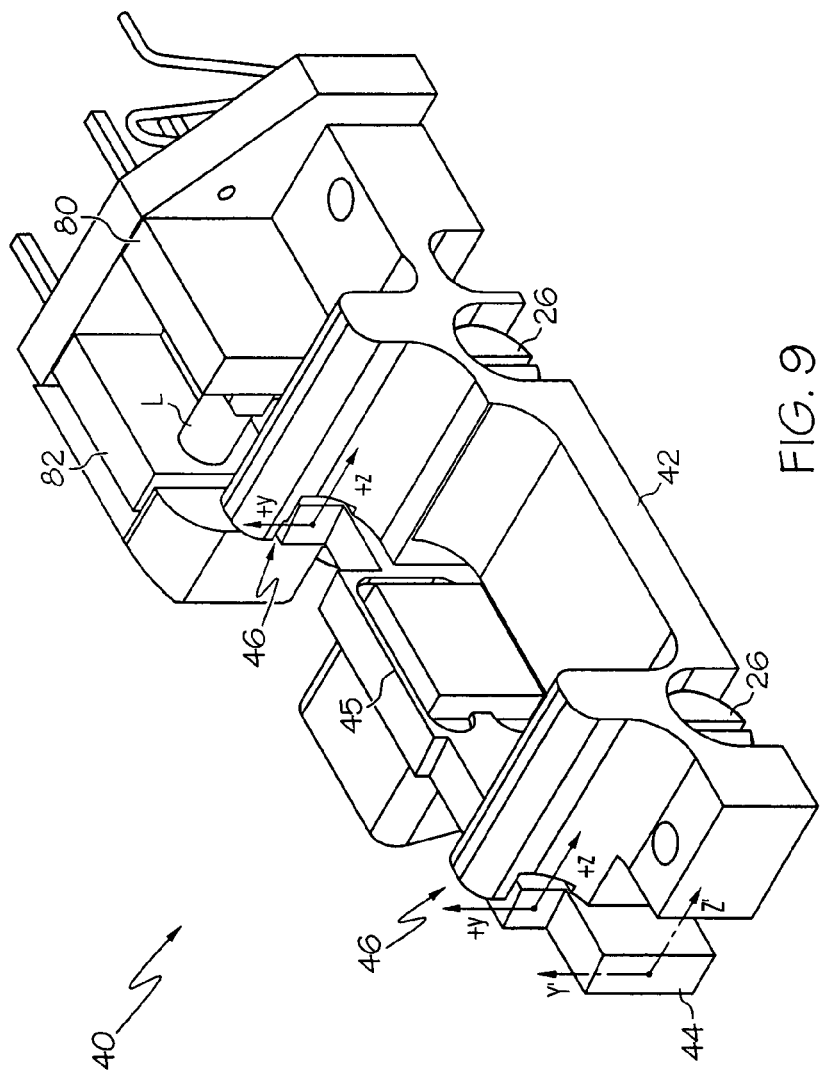
FIG. 9 is an isometric illustration of a stationary slit mechanism according to the embodiment of the present invention illustrated in FIGS. 1-7.

Referring to the stationary slit mechanism 40 as illustrated in FIG. 9, it is noted that the mechanism 40 comprises, among other things, a stationary fixture 42 and a slit edge attachment 44 secured to the stationary fixture 42. The slit edge attachment 44 defines the aperture defining edge 45 of the stationary slit mechanism 40. The stationary fixture 42 defines stationary slit mechanism fixturing datums 46 that are configured to establish alignment of the slit edge attachment 44 in a unitary set of position coordinates along a pair of orthogonal axes Y', Z' defined by the stationary fixture 42. Specifically, as is illustrated in FIG. 9, each of the fixturing datums 46 comprises generally orthogonal abutments that restrict movement of a properly positioned slit edge attachment 44 in the two orthogonal directions +y, +z.

The energy selecting slit assembly 10 further comprises one or more securements 26 independent of the fixturing datums 22, 24, 36, 46. The securements 26 are configured to fix the opposing slit mechanisms 30, 40 and the slit edge attachments 34, 44 in the respective positions established by the fixturing datums 22, 24, 36, 46. It is noted that use of the securements alone to align and fix the subject components is likely to be less precise than use of the fixturing datums 22, 24 with the securements 26 because the fixturing datums 22, 24 comprise precision machined structures that are formed integrally with the chassis or the respective slit mechanisms. As a result, the datums are characterized by a degree of precision exceeding that of the securements 26. In addition, it is noted that the fixturing datums 22, 24 provide for less cumbersome alignment because although they are configured to restrict movement of an object to be aligned to at least two orthogonal directions, they are also configured to permit movement of the object to be aligned in one or more directions opposite the restricted directions.

Finally, referring collectively to FIGS. 8 and 9 and the teachings of U.S. Pat. No. 5,640,012, it is noted that the present invention also contemplates the incorporation of a light source 80 and detector 82 for facilitating automated control of the size of the aperture defined between the aperture defining edges 35, 45 of the opposing slit mechanisms 30, 40. Specifically, a signal indicative of the aperture size can be derived by measuring the amount of light L that passes from the source 80 to the detector 82, uninterrupted by a duplicate aperture defining edge 37 configured to simulate the extent to which the aperture defining edge 35 interrupts the charged particle beam E. The position of the duplicate aperture defining edge 37 is also established through the use of the above-described fixturing datums because it is formed integrally with the slit edge attachment 34.

For the purposes of defining and describing the present invention, it is noted that the various references to "imaging" herein are intended to encompass a variety of charged particle detection and analysis systems including, and not limited to, conventional and yet to be developed CCD imaging techniques, energy-filtered diffraction techniques, electron energy loss spectrum analysis techniques, etc.

It is noted that teachings regarding the specific materials for use in forming the various components of the energy selecting slit assembly of the present invention are beyond the scope of the present invention and may be gleaned from a variety of available and yet to evolve sources. Similarly, teachings regarding the specific means by which imaging and analysis of charged particles filtered according to the present invention can be achieved are also beyond the scope of the present invention and may be gleaned from a variety of available and yet to evolve sources.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "device" is utilized herein to represent a combination of components and individual components, regardless of whether the components are combined with other components. For example, a "device" according to the present invention may comprise an energy selecting slit assembly, an imaging system incorporating an energy selecting slit assembly according to the present invention, an electron microscope incorporating a imaging system according to the present invention, etc.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A device comprising an energy selecting slit assembly, said slit assembly comprising a slit assembly chassis, opposing slit mechanisms, and an actuator assembly, wherein:
    said opposing slit mechanisms and said actuator assembly are mechanically coupled to said slit assembly chassis;
    said opposing slit mechanisms are configured to define a charged particle aperture between respective aperture-defining edges of said opposing slit mechanisms;
    one of said opposing slit mechanisms comprises a rotational slit mechanism and defines a longitudinal axis of rotation about which said rotational slit mechanism is configured to pivot;
    said actuator assembly comprises an actuator arm comprising a pair of terminal ends, one of said terminal ends comprising relatively fixed terminus and another of said terminal ends comprising a relatively mobile terminus;
    said actuator arm is secured to said slit assembly chassis proximate said relatively fixed terminus;
    said actuator arm is coupled to said rotational slit mechanism via a mechanical coupling positioned proximate said relatively mobile terminus; and
    said mechanical coupling is configured to couple movement of said relatively mobile terminus of said actuator arm with movement of said rotational slit mechanism about said longitudinal axis of rotation of said rotational slit mechanism.

2. A device as claimed in claim 1 wherein said mechanical coupling comprises a wobblestick.

3. A device as claimed in claim 2 wherein said actuator arm and said rotational slit mechanism comprise respective wobblestick receptors configured to permit said wobblestick to pivot within said receptor.

4. A device as claimed in claim 3 wherein:
one of said wobblestick receptors in mounted to or formed within said actuator arm proximate said relatively mobile terminus of said arm; and
another of said wobblestick receptors is mounted to or formed within said rotational slit mechanism, displaced from said longitudinal axis of rotation.

5. A device as claimed in claim 1 wherein said actuator arm comprises a piezoelectric bender.

6. A device as claimed in claim 1 wherein said actuator assembly further comprises an actuator mounting assembly configured to secure said actuator arm in predisposed relation to said slit assembly chassis.

7. A device as claimed in claim 6 wherein said actuator assembly is configured to define a fulcrum about which said actuator mounting assembly pivots.

8. A device as claimed in claim 7 wherein said actuator arm is configured to bend about said fulcrum defined by said actuator mounting assembly.

9. A device as claimed in claim 8 wherein said actuator mounting assembly comprises an adjustment mechanism configured to vary the degree to which said actuator mounting assembly pivots about said fulcrum.

10. A device as claimed in claim 8 wherein said actuator assembly further comprises an electrically insulating insert configured to interface said actuator arm and said actuator mounting assembly with said slit assembly chassis.

11. A device as claimed in claim 10 wherein said electrically insulating insert is configured to define a consistently repeatable spacing between said actuator arm and said slit assembly chassis.

12. A device as claimed in claim 6 wherein said actuator mounting assembly comprises an arm adjustment mechanism configured to adjust said predisposed relation of said actuator arm.

13. A device as claimed in claim 12 wherein said actuator mounting assembly is configured to maintain a non-contact relationship with said relatively mobile terminus.

14. A device as claimed in claim 1 wherein said respective aperture-defining edges of said opposing slit mechanisms are oriented substantially parallel to each other and said longitudinal axis of rotation of said rotational slit mechanism is parallel to said respective aperture-defining edges.

15. A device as claimed in claim 1 wherein the other of said opposing slit mechanisms comprises a stationary slit mechanism.

16. A device as claimed in claim 1 wherein:
said slit assembly chassis defines three orthogonal X, Y, and Z axes;
said longitudinal axis of rotation is parallel to said X-axis;
said opposing slit mechanisms are configured to define a charged particle aperture between respective aperture-defining edges of said opposing slit mechanisms such that said aperture varies in size in a direction parallel to said Y axis with rotation of said of rotational slit mechanism about said longitudinal axis of rotation;
said slit assembly chassis defines a plurality of fixturing datums configured to establish alignment of said respective aperture-defining edges of said opposing slit mechanisms along said Y and Z axes; and
said energy selecting slit assembly further comprises one or more securements independent of said fixturing datums, said securements being configured to fix said opposing slit mechanisms in respective positions established by said fixturing datums.

17. A device as claimed in claim 1 wherein said device further comprises a chassis mounting assembly secured to one or both ends of said chassis and configured to secure said chassis via a hermetically sealed port of a vacuum chamber.

18. A device as claimed in claim 1 wherein said device comprises a charged particle imaging system and said energy selecting slit assembly is incorporated within said imaging system.

19. A device as claimed in claim 1 wherein said device comprises a charged particle microscope and said energy selecting slit assembly is incorporated within an imaging system of said microscope.

20. A device comprising an energy selecting slit assembly, said slit assembly comprising a slit assembly chassis, opposing slit mechanisms, and an actuator assembly, wherein:
said slit assembly chassis defines three orthogonal X, Y, and Z axes;
one of said opposing slit mechanisms comprises a rotational slit mechanism and defines a longitudinal axis of rotation about which said rotational slit mechanism is configured to pivot;
said longitudinal axis of rotation is parallel to said X-axis defined by said slit assembly chassis;
the other of said opposing slit mechanisms comprises a stationary slit mechanism;
said actuator assembly is configured to pivot said rotational slit mechanism about said longitudinal axis of rotation;
said opposing slit mechanisms are configured to define a charged particle aperture between respective aperture-defining edges of said opposing slit mechanisms such that said aperture varies in size in a direction parallel to said Y axis with rotation of said of rotational slit mechanism about said longitudinal axis of rotation;
said slit assembly chassis defines a plurality of fixturing datums configured to establish alignment of said respective aperture-defining edges of said opposing slit mechanisms along said Y and Z axes; and
said energy selecting slit assembly further comprises one or more securements independent of said fixturing datums, said securements being configured to fix said opposing slit mechanisms in respective positions established by said fixturing datums.

21. A device as claimed in claim 20 wherein said fixturing datums are characterized by a degree of precision exceeding that of said securements.

22. A device as claimed in claim 20 wherein said fixturing datums are configured to restrict movement of an object to be aligned to at least two orthogonal directions and permit movement of said object to be aligned in at least two directions opposite said orthogonal directions.

23. A device as claimed in claim 20 wherein:
said slit assembly chassis defines a plurality of fixturing datums configured to establish alignment of said stationary slit mechansim with a unitary set of position coordinates along said Y and Z axes; and
said energy selecting slit assembly further comprises one or more securements independent of said fixturing datums, said securements being configured to fix said stationary slit mechanism in said unitary set of position coordinates established by said fixturing datums.

24. A device as claimed in claim 23 wherein said fixturing datums are configured to establish alignment of said stationary slit mechanism with a unitary set of position coordinates along said X, Y, and Z axes.

25. A device as claimed in claim 23 wherein:
at least one of said fixturing datums is configured to establish alignment of said stationary slit mechanism along said Z axis; and
another of said fixturing datums is configured to establish alignment of said stationary slit mechanism along said Y axis.

26. A device as claimed in claim 23 wherein at least one of said fixturing datums comprises a pair of complementary bore holes formed in said slit assembly chassis and said stationary slit mechanism such that at least one fixturing pin may be inserted through said complementary bore holes and removed from said bore holes subsequent to said fixation of said stationary slit mechanism in said unitary set of position coordinates.

27. A device as claimed in claim 26 wherein said complementary bore holes are oriented generally parallel to said Y axis so as to allow said fixturing pin to align said stationary slit mechanism along said X and Z axes.

28. A device as claimed in claim 23 wherein:
at least one of said fixturing datums comprises an abutment defined by said slit assembly chassis and said stationary slit mechanism; and
said abutment is configured to establish a minimum clearance between opposing surfaces of said slit assembly chassis and said stationary slit mechanism along said Y axis.

29. A device as claimed in claim 23 wherein:
said stationary slit mechanism comprises a stationary fixture and a slit edge attachment secured to said stationary fixture defining said aperture-defining edge of said stationary slit mechanism;
said slit edge attachment and said stationary fixture define at least one fixturing datum configured to establish alignment of said slit edge attachment with a unitary set of position coordinates along a pair of orthogonal axes defined by said stationary fixture; and
said stationary slit mechanism further comprises one or more securements independent of said fixturing datums, said securements being configured to fix said slit edge attachment in said unitary set of position coordinates along said orthogonal axes defined by said stationary fixture.

30. A device as claimed in claim 20 wherein:
said slit assembly chassis defines a plurality of fixturing datums configured to establish alignment of said rotational slit mechanism with a unitary set of position coordinates along said Y and Z axes; and
said energy selecting slit assembly further comprises one or more securements independent of said fixturing datums, said securements being configured to fix said rotational slit mechanism in said unitary set of position coordinates established by said fixturing datums.

31. A device as claimed in claim 30 wherein:
at least one of said fixturing datums comprises a pair of rotational pivots defined along said longitudinal axis of rotation of said rotational slit mechanism;
said pair of rotational pivots are configured to align said rotational slit mechanism along a pair of orthogonal axes defined by said rotational slit mechanism.

32. A device as claimed in claim 30 wherein:
said rotational slit mechanism comprises a rotational fixture and a slit edge attachment secured to said rotational fixture defining said aperture-defining edge of said rotational slit mechanism;
said slit edge attachment and said rotational fixture define at least one fixturing datum configured to establish alignment of said slit edge attachment with a unitary set of position coordinates along a pair of orthogonal axes defined by said rotational fixture; and
said rotational slit mechanism further comprises one or more securements independent of said fixturing datums, said securements being configured to fix said slit edge attachment in said unitary set of position coordinates along said orthogonal axes defined by said rotational fixture.

* * * * *